United States Patent
Hasebe et al.

(10) Patent No.: US 7,300,885 B2
(45) Date of Patent: *Nov. 27, 2007

(54) FILM FORMATION APPARATUS AND METHOD FOR SEMICONDUCTOR PROCESS

(75) Inventors: Kazuhide Hasebe, Minamialps (JP); Pao-Hwa Chou, Kai (JP)

(73) Assignee: Tokyo Electron Limited, Tokyo (JP)

( * ) Notice: Subject to any disclaimer, the term of this patent is extended or adjusted under 35 U.S.C. 154(b) by 17 days.

This patent is subject to a terminal disclaimer.

(21) Appl. No.: 11/166,073

(22) Filed: Jun. 27, 2005

(65) Prior Publication Data

US 2005/0287775 A1 Dec. 29, 2005

(30) Foreign Application Priority Data

Jun. 28, 2004 (JP) ............................. 2004-190233
Feb. 23, 2005 (JP) ............................. 2005-048059

(51) Int. Cl.
*H01L 21/31* (2006.01)

(52) U.S. Cl. ................ 438/758; 438/778; 427/255.393

(58) Field of Classification Search ................ 438/758, 438/762, 763–765, 769, 770, 775, 778, 791; 738/775, 791; 427/248.1, 255.23, 255.28, 427/255.39, 255.393

See application file for complete search history.

(56) References Cited

U.S. PATENT DOCUMENTS

| 7,094,708 B2* | 8/2006 | Kato et al. ................... 438/778 |
| 2006/0032443 A1* | 2/2006 | Hasebe et al. ............... 118/715 |
| 2006/0205231 A1* | 9/2006 | Chou et al. ................. 438/770 |

FOREIGN PATENT DOCUMENTS

| JP | 6-45256 | 2/1994 |
| JP | 11-87341 | 3/1999 |
| JP | 2004-6801 | 1/2004 |

* cited by examiner

*Primary Examiner*—Brook Kebede
(74) *Attorney, Agent, or Firm*—Oblon, Spivak, McClelland, Maier & Neustadt, P.C.

(57) ABSTRACT

A film formation method for a semiconductor process is arranged to form a thin film on a target substrate by CVD, while supplying a first process gas for film formation and a second process gas for reacting with the first process gas to a process field accommodating the target substrate. The method alternately includes first to fourth steps. The first step performs supply of the first and second process gases to the process field. The second step stops supply of the first and second process gases to the process field. The third step performs supply of the second process gas to the process field while stopping supply of the first process gas to the process field. The fourth step stops supply of the first and second process gases to the process field.

20 Claims, 12 Drawing Sheets

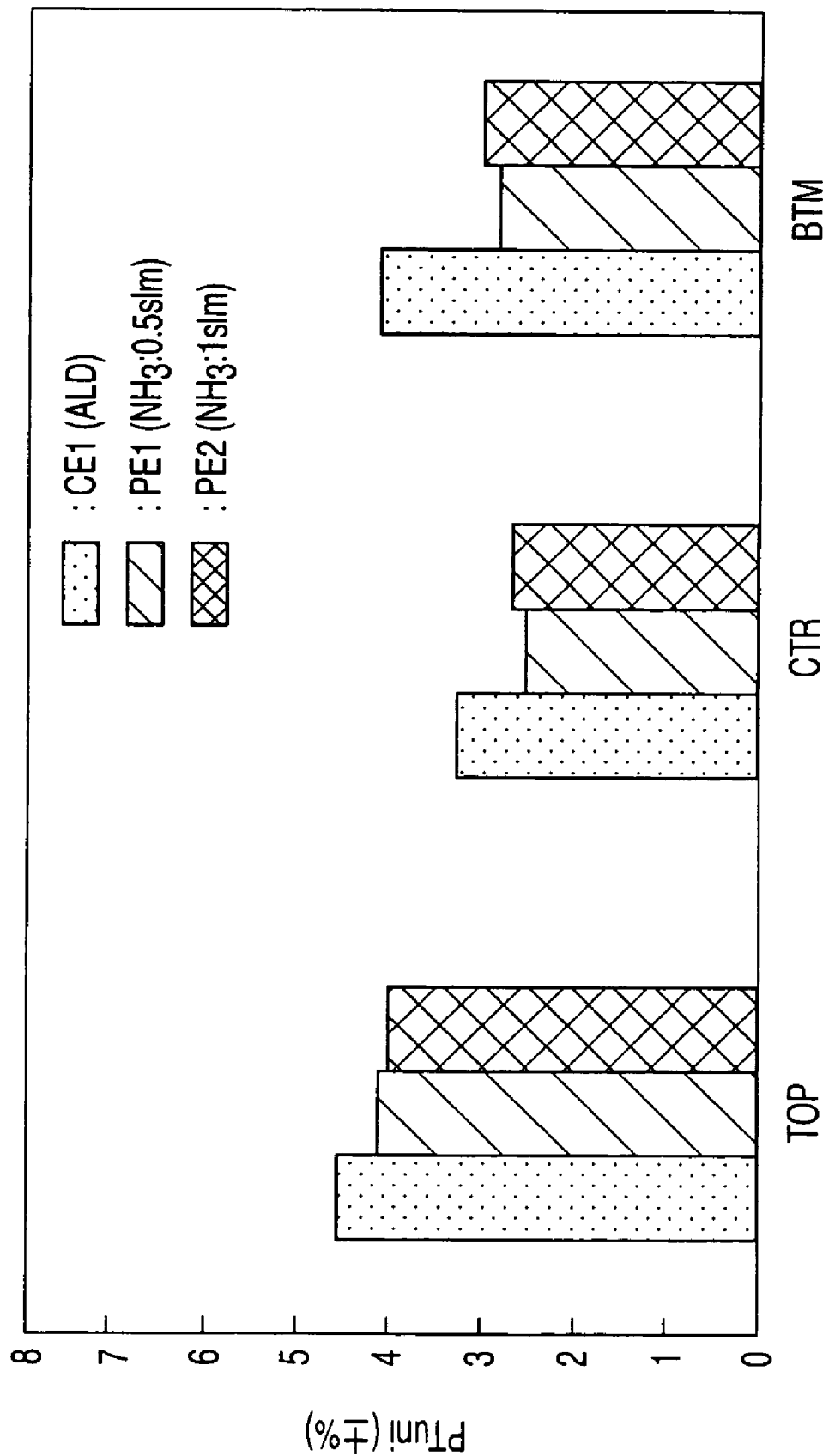
F I G. 6

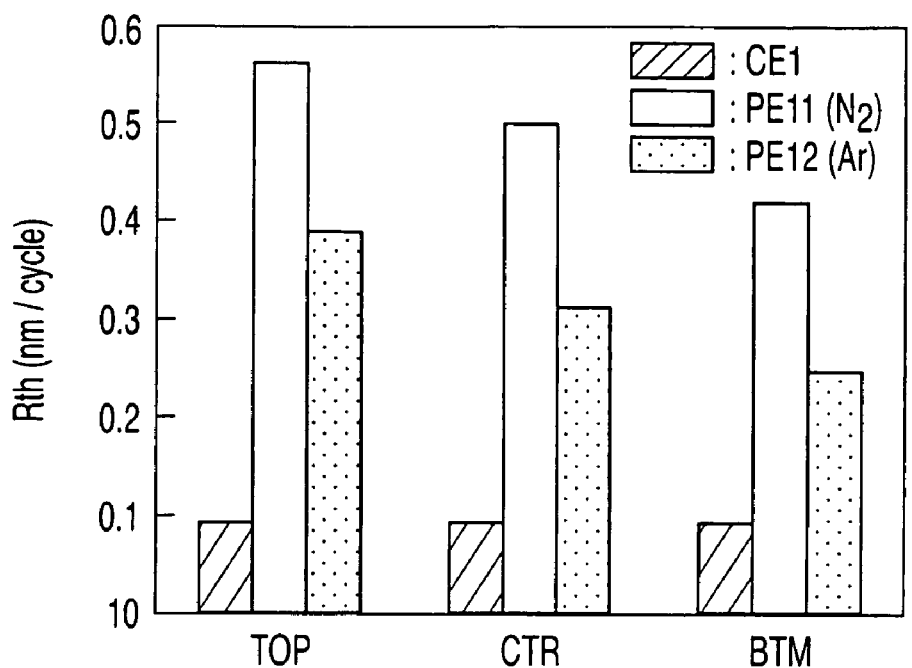
F I G. 11A
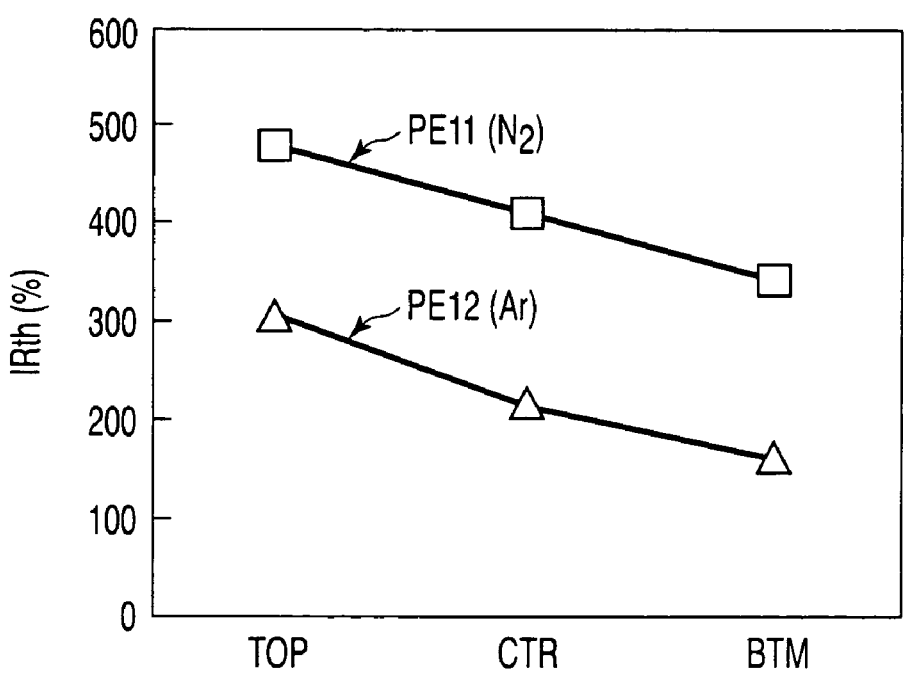
F I G. 11B

FILM FORMATION APPARATUS AND METHOD FOR SEMICONDUCTOR PROCESS

CROSS-REFERENCE TO RELATED APPLICATIONS

This application is based upon and claims the benefit of priority from prior Japanese Patent Applications No. 2004-190233, filed Jun. 28, 2004; and No. 2005-048059, filed Feb. 23, 2005, the entire contents of both of which are incorporated herein by reference.

BACKGROUND OF THE INVENTION

1. Field of the Invention

The present invention relates to a film formation apparatus and method for a semiconductor process for forming a thin film on a target substrate, such as a semiconductor wafer. The term "semiconductor process" used herein includes various kinds of processes which are performed to manufacture a semiconductor device or a structure having wiring layers, electrodes, and the like to be connected to a semiconductor device, on a target substrate, such as a semiconductor wafer or a glass substrate used for an LCD (Liquid Crystal Display) or FPD (Flat Panel Display), by forming semiconductor layers, insulating layers, and conductive layers in predetermined patterns on the target substrate.

2. Description of the Related Art

In manufacturing semiconductor devices for constituting semiconductor integrated circuits, a target substrate, such as a semiconductor wafer, is subjected to various processes, such as film formation, oxidation, diffusion, reformation, annealing, and etching. Jpn. Pat. Appln. KOKAI Publication No. 2004-6801 discloses a semiconductor processing method of this kind performed in a vertical heat-processing apparatus (of the so-called batch type). According to this method, semiconductor wafers are first transferred from a wafer cassette onto a vertical wafer boat and supported thereon at intervals in the vertical direction. The wafer cassette can store, e.g., 25 wafers, while the wafer boat can support 30 to 150 wafers. Then, the wafer boat is loaded into a process container from below, and the process container is airtightly closed. Then, a predetermined heat-process is performed, while the process conditions, such as process gas flow rate, process pressure, and process temperature, are controlled.

In recent years, owing to the demands of increased miniaturization and integration of semiconductor integrated circuits, it is required to alleviate the thermal history of semiconductor devices in manufacturing steps, thereby improving the characteristics of the devices. For vertical processing apparatuses, it is also required to improve semiconductor processing methods in accordance with the demands described above. For example, there is a CVD (Chemical Vapor Deposition) method for a film formation process, which performs film formation while intermittently supplying a source gas and so forth to repeatedly form layers each having an atomic or molecular level thickness, one by one, or several by several (for example, Jpn. Pat. Appln. KOKAI Publication Nos. 6-45256 and 11-87341). In general, this film formation method is called ALD (Atomic layer Deposition), which allows a predetermined process to be performed without exposing wafers to a very high temperature.

FIG. 13 is a timing chart of the gas supply and RF application of a conventional film formation method, where dichlorosilane (DCS) and $NH_3$ are supplied as a silane family gas and a nitriding gas, respectively, to form a silicon nitride film (SiN). As shown in FIG. 13, DCS and $NH_3$ gas are alternately and intermittently supplied into a process container with purge periods interposed therebetween. When $NH_3$ gas is supplied, an RF (radio frequency) is applied to generate plasma within the process container so as to promote a nitridation reaction. Specifically, when DCS is supplied into the process container, a layer with a thickness of one molecule or more of DCS is adsorbed onto the surface of wafers. The superfluous DCS is removed during the purge period. Then, $NH_3$ is supplied and plasma is generated, thereby performing low temperature nitridation to form a silicon nitride film. These sequential steps are repeated to complete a film having a predetermined thickness.

According to the film formation method described above, it is possible to obtain relatively good step coverage, and also improve the film quality, because the number of Si—H bonds in the film is reduced due to a lower temperature, as compared to a case where a CVD film formation method is performed at a higher temperature. However, conventional film formation methods of this kind can attain only a very low film formation rate and thus low throughput, in spite of plasma being used to promote the reaction.

BRIEF SUMMARY OF THE INVENTION

An object of the present invention is to provide a film formation method and film formation apparatus, which can greatly improve the film formation rate while maintaining a high film quality.

According to a first aspect of the present invention, there is provided a film formation method for a semiconductor process for forming a thin film on a target substrate by CVD, while supplying a first process gas for film formation and a second process gas for reacting with the first process gas to a process field accommodating the target substrate, the method alternately comprising:

a first step of performing supply of the first and second process gases to the process field;

a second step of stopping supply of the first and second process gases to the process field;

a third step of performing supply of the second process gas to the process field while stopping supply of the first process gas to the process field; and a fourth step of stopping supply of the first and second process gases to the process field.

According to a second aspect of the present invention, there is provided a film formation method for a semiconductor process for forming a thin film on a target substrate by CVD, while supplying a first process gas for film formation, a second process gas for reacting with the first process gas, and a third process gas different from first and second process gases to a process field accommodating the target substrate, the method alternately comprising:

a first step of performing supply of the first and third process gases to the process field while stopping supply of the second process gas to the process field, the first step comprising a period of supplying the third process gas to the process field while exciting the third process gas by an exciting mechanism;

a second step of stopping supply of the first to third process gases to the process field;

a third step of performing supply of the second process gas to the process field while stopping supply of the first and third process gases to the process field; and a fourth step of stopping supply of the first to third process gases to the process field.

According to a third aspect of the present invention, there is provided a film formation apparatus for a semiconductor process, comprising:

a process container having a process field configured to accommodate a target substrate;

a support member configured to support the target substrate inside the process field;

a heater configured to heat the target substrate inside the process field;

an exhaust system configured to exhaust gas inside the process field;

a first process gas supply circuit configured to supply a first process gas for film formation to the process field;

a second process gas supply circuit configured to supply a second process gas for reacting with the first process gas to the process field;

an exciting mechanism configured to selectively excite the second process gas to be supplied to the process field; and a control section configured to control an operation of the apparatus.

According to a fourth aspect of the present invention, there is provided a computer readable medium containing program instructions for execution on a processor, which is used for a film-formation apparatus for a semiconductor process for forming a thin film on a target substrate by CVD, while supplying a first process gas for film formation and a second process gas for reacting with the first process gas to a process field accommodating the target substrate, wherein the program instructions, when executed by the processor, cause the film-formation apparatus to execute a first step of performing supply of the first and second process gases to the process field;

a second step of stopping supply of the first and second process gases to the process field;

a third step of performing supply of the second process gas to the process field while stopping supply of the first process gas to the process field; and a fourth step of stopping supply of the first and second process gases to the process field.

According to a fifth aspect of the present invention, there is provided a computer readable medium containing program instructions for execution on a processor, which is used for a film-formation apparatus for a semiconductor process for forming a thin film on a target substrate by CVD, while supplying a first process gas for film formation, a second process gas for reacting with the first process gas, and a third process gas different from first and second process gases to a process field accommodating the target substrate, wherein the program instructions, when executed by the processor, cause the film-formation apparatus to execute a first step of performing supply of the first and third process gases to the process field while stopping supply of the second process gas to the process field, the first step comprising a period of supplying the third process gas to the process field while exciting the third process gas by an exciting mechanism;

a second step of stopping supply of the first to third process gases to the process field;

a third step of performing supply of the second process gas to the process field while stopping supply of the first and third process gases to the process field; and a fourth step of stopping supply of the first to third process gases to the process field.

In the first to fifth aspects, the first process gas may contain a silane family gas, the second process gas may contain a nitriding gas or oxy-nitriding gas, and the third process gas may contain a gas selected from the group consisting of nitrogen gas, rare gas, and nitrogen oxide gas. For example, the first process gas may contain at least one gas selected from the group consisting of dichlorosilane (DCS), hexachlorodisilane (HCD), monosilane ($SiH_4$), disilane ($Si_2Cl_6$), hexamethyldisilazane (HMDS), tetrachlorosilane (TCS), disilylamine (DSA), trisilylamine (TSA), bis-tertialbutylaminosilane (BTBAS). Further, for example, the second process gas may contain at least one gas selected from the group consisting of ammonia ($NH_3$), nitrogen ($N_2$), dinitrogen oxide ($N_2O$), and nitrogen oxide (NO).

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

FIG. 6 is a graph showing planar uniformity of the film thickness of a silicon nitride film, obtained by Experiment 1;

FIG. 11A is a graph showing film formation rate of a silicon nitride film, obtained by Experiment 3 according to the second embodiment;

FIG. 11B is a graph showing improvement ratio of film formation rate of a silicon nitride film, obtained by Experiment 3;

DETAILED DESCRIPTION OF THE INVENTION

Figure 1:
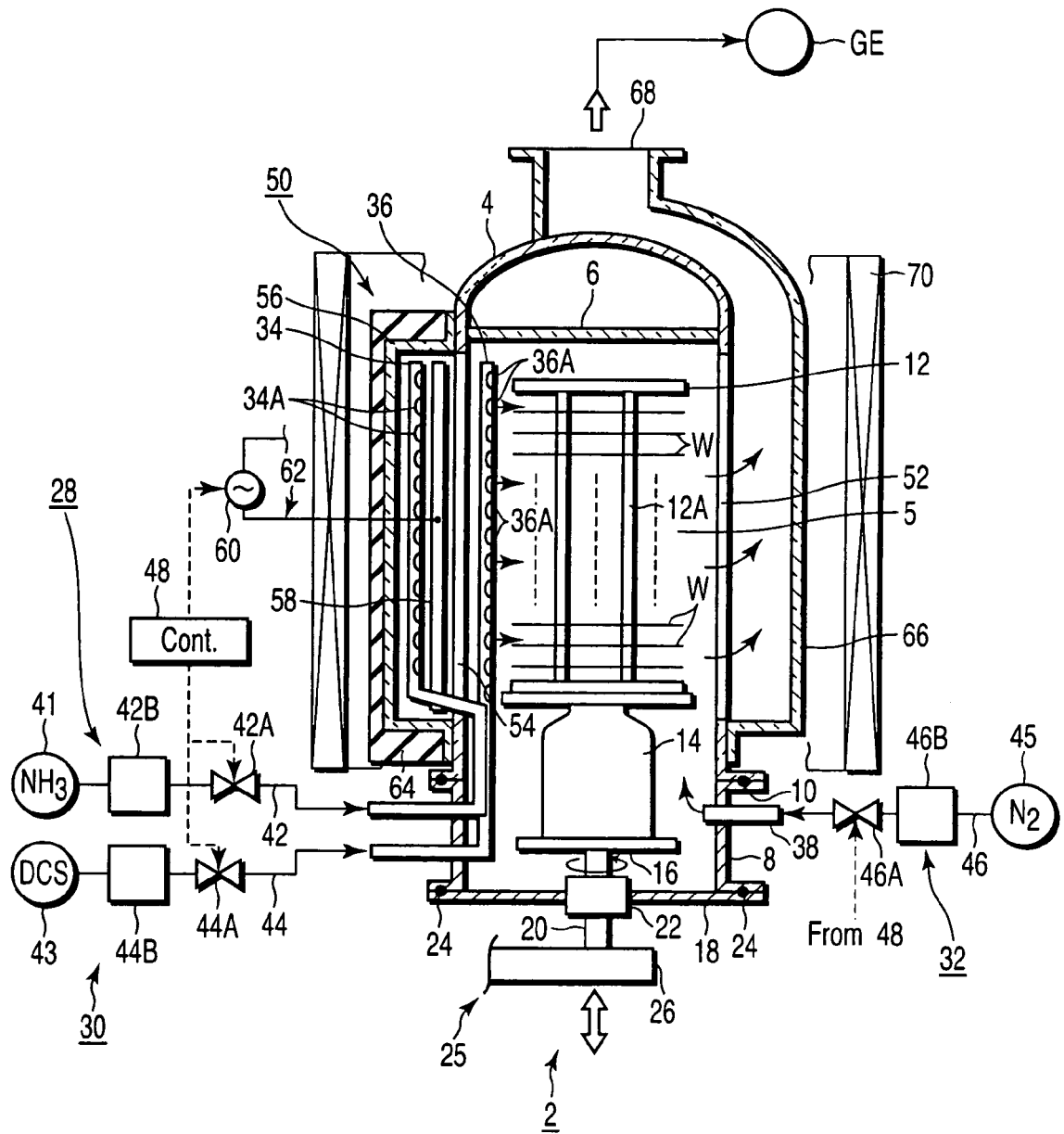
FIG. 1 is a sectional view showing a film formation apparatus (vertical CVD apparatus) according to a first embodiment of the present invention.

Embodiments of the present invention will now be described with reference to the accompanying drawings. In the following description, the constituent elements having substantially the same function and arrangement are denoted by the same reference numerals, and a repetitive description will be made only when necessary.

First Embodiment

Figure 2:
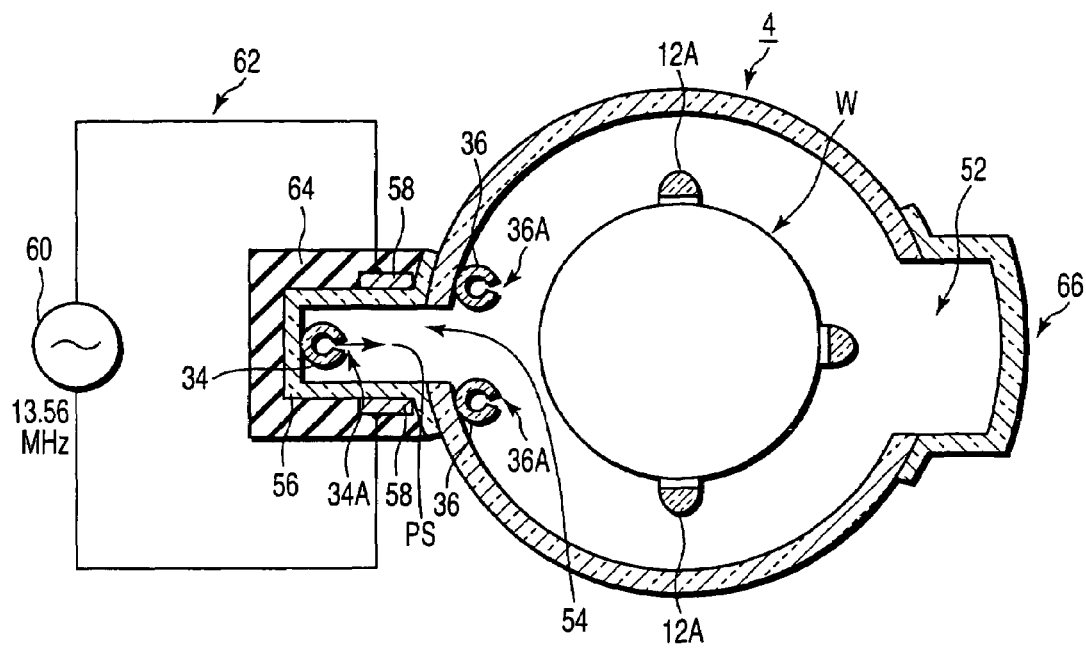
FIG. 2 is a sectional plan view showing part of the apparatus shown in FIG. 1.

FIG. 1 is a sectional view showing a film formation apparatus (vertical CVD apparatus) according to a first embodiment of the present invention. FIG. 2 is a sectional plan view showing part of the apparatus shown in FIG. 1. The film formation apparatus 2 is arranged to supply a source gas (first process gas) and an assist gas (second process gas) to deposit a silicon nitride film (SiN), wherein the source gas contains dichlorosilane (DCS) gas as a silane family gas, and the assist gas contains ammonia ($NH_3$) gas as a nitriding gas.

The apparatus 2 includes a process container 4 shaped as a cylindrical column with a ceiling and an opened bottom, in which a process field 5 is defined to accommodate and process a plurality of semiconductor wafers (target substrates) stacked at intervals. The entirety of the process container 4 is made of, e.g., quartz. The top of the process container 4 is provided with a quartz ceiling plate 6 to airtightly seal the top. The bottom of the process container 4 is connected through a seal member 10, such as O-ring, to a cylindrical manifold 8.

The cylindrical manifold 8 is made of, e.g., stainless steel, and supports the bottom of the process container 4. A wafer boat 12 made of quartz is moved up and down through the bottom port of the manifold 8, so that the wafer boat 12 is loaded/unloaded into and from the process container 4. A number of target substrates or semiconductor wafers W are stacked on a wafer boat 12. For example, in this embodiment, the wafer boat 12 has struts 12A that can support, e.g., about 50 to 100 wafers having a diameter of 300 mm at essentially regular intervals in the vertical direction.

The wafer boat 12 is placed on a table 16 through a heat-insulating cylinder 14 made of quartz. The table 16 is supported by a rotary shaft 20, which penetrates a lid 18 made of, e.g., stainless steel, and is used for opening/closing the bottom port of the manifold 8.

The portion of the lid 18 where the rotary shaft 20 penetrates is provided with, e.g., a magnetic-fluid seal 22, so that the rotary shaft 20 is rotatably supported in an airtightly sealed state. A seal member 24, such as an O-ring, is interposed between the periphery of the lid 18 and the bottom of the manifold 8, so that the interior of the process container 4 can be kept sealed.

The rotary shaft 20 is attached at the distal end of an arm 26 supported by an elevating mechanism 25, such as a boat elevator. The elevating mechanism 25 moves the wafer boat 12 and lid 18 up and down integratedly. The table 16 may be fixed to the lid 18, so that wafers W are processed without rotation of the wafer boat 12.

A gas supply section is connected to the side of the manifold 8 to supply predetermined process gases to the process field 5 within the process container 4. More specifically, the gas supply section includes an assist gas supply circuit (second process gas supply circuit) 28, a source gas supply circuit (first process gas supply circuit) 30, and a purge gas supply circuit 32. The source gas supply circuit 30 is arranged to supply a silane family gas, such as DCS (dichlorosilane) gas, as a source gas for film formation (first process gas). The assist gas supply circuit 28 is arranged to supply an assist gas (second process gas), such as ammonia ($NH_3$) gas, which reacts with the source gas while being selectively turned into plasma. The purge gas supply circuit 32 is arranged to supply an inactive gas, such as $N_2$ gas, as a purge gas. Each of the source gas and assist gas (first and second process gases) is mixed with a suitable amount of carrier gas, as needed. However, such a carrier gas will not be mentioned, hereinafter, for the sake of simplicity of explanation.

More specifically, the source gas supply circuit 30 includes two gas distribution nozzles 36 formed of quartz pipes, which penetrate the sidewall of the manifold 8 from the outside and then turn and extend upward (see FIG. 2). Each of the gas distribution nozzles 36 has a plurality of gas spouting holes 36A formed at predetermined intervals in the longitudinal direction (the vertical direction) over all the wafers W on the wafer boat 12. The gas spouting holes 36A deliver the source gas almost uniformly in the horizontal direction, so as to form gas flows parallel with the wafers W on the wafer boat 12. The apparatus may have not two but only one first nozzle 36.

The assist gas supply circuit 28 also includes a gas distribution nozzle 34 formed of a quartz pipe, which penetrates the sidewall of the manifold 8 from the outside and then turns and extends upward. The gas distribution nozzle 34 has a plurality of gas spouting holes 34A formed at predetermined intervals in the longitudinal direction (the vertical direction) over all the wafers W on the wafer boat 12. The gas spouting holes 34A deliver the assist gas almost uniformly in the horizontal direction, so as to form gas flows parallel with the wafers W on the wafer boat 12. The purge gas supply circuit 32 includes a gas nozzle 38, which penetrates the sidewall of the manifold 8 from the outside.

The nozzles 34, 36, and 38 are connected to a gas sources 41, 43, and 45 of $NH_3$ gas, DCS gas and $N_2$ gas, respectively, through gas supply lines (gas passages) 42, 44, and 46, respectively. The gas supply lines 42, 44, and 46 are provided with switching valves 42A, 44A, and 46A and flow rate controllers 42B, 44B, and 46B, such as mass flow controllers, respectively. With this arrangement, $NH_3$ gas, DCS gas, and $N_2$ gas can be supplied at controlled flow rates.

A gas exciting section 50 is formed at the sidewall of the process container 4 along the vertical direction. On the side of the process container 4 opposite to the gas exciting section 50, a long and thin exhaust port 52 for exhausting the inner atmosphere is formed by cutting the sidewall of the process container 4 in, e.g., the vertical direction.

More specifically, the gas exciting section 50 has a vertically long and thin opening 54 formed by cutting a predetermined width of the sidewall of the process container 4, in the vertical direction. The opening 54 is covered with a quartz cover 56 airtightly connected to the outer surface of the process container 4 by welding. The cover 56 has a vertical long and thin shape with a concave cross-section, so that it projects outward from the process container 4.

With this arrangement, the gas exciting section 50 is formed such that it projects outward from the sidewall of the process container 4 and is opened on the other side to the interior of the process container 4. In other words, the inner space of the gas exciting section 50 communicates with the process field 5 within the process container 4. The opening 54 has a vertical length sufficient to cover all the wafers W on the wafer boat 12 in the vertical direction.

A pair of long and thin electrodes 58 are disposed on the opposite outer surfaces of the cover 56, and face each other along the longitudinal direction (the vertical direction). The electrodes 58 are connected to an RF (Radio Frequency) power supply 60 for plasma generation, through feed lines 62. An RF voltage of, e.g., 13.56 MHz is applied to the electrodes 58 to form an RF electric field for exciting plasma between the electrodes 58. The frequency of the RF voltage is not limited to 13.56 MHz, and it may be set at another frequency, e.g., 400 kHz.

The gas distribution nozzle 34 is bent outward in the radial direction of the process container 4, at a position lower than the lowermost wafer W on the wafer boat 12. Then, the gas distribution nozzle 34 vertically extends at the deepest position (the farthest position from the center of the process container 4) in the gas exciting section 50. As shown also in FIG. 2, the gas distribution nozzle 34 is separated outward from an area sandwiched between the pair of electrodes 58 (a position where the RF electric field is most intense), i.e., a plasma generating area PS where the main plasma is actually generated. The assist gas containing $NH_3$ gas is spouted from the gas spouting holes 34A of the gas distribution nozzle 34 toward the plasma generating area PS. Then, the assist gas is excited (decomposed or activated) in the plasma generating area PS, and is supplied in this state onto the wafers W on the wafer boat 12.

An insulating protection cover 64 made of, e.g., quartz is attached on and covers the outer surface of the cover 56. A cooling mechanism (not shown) is disposed in the insulating protection cover 64 and comprises coolant passages respectively facing the electrodes 58. The coolant passages are supplied with a coolant, such as cooled nitrogen gas, to cool the electrodes 58. The insulating protection cover 64 is covered with a shield (not shown) disposed on the outer surface to prevent RF leakage.

The two gas distribution nozzles 36 extend upward at positions near and outside the opening 54 of the gas exciting section 50, i.e., on both sides of the outside of the opening 54 (in the process container 4). The source gas containing DCS gas is spouted from the gas spouting holes 36A of the gas distribution nozzles 36 toward the center of the process container 4.

On the other hand, the exhaust port 52, which is formed opposite the gas exciting section 50, is covered with an exhaust port cover member 66. The exhaust port cover member 66 is made of quartz with a U-shape cross-section, and attached by welding. The exhaust cover member 66 extends upward along the sidewall of the process container 4, and has a gas outlet 68 at the top of the process container 4. The gas outlet 68 is connected to a vacuum-exhaust system GE including a vacuum pump and so forth.

The process container 4 is surrounded by a heater 70, which is used for heating the atmosphere within the process container 4 and the wafers W. A thermocouple (not shown) is disposed near the exhaust port 52 in the process container 4 to control the heater 70.

The film formation apparatus 2 further includes a main control section 48 formed of, e.g., a computer, to control the entire apparatus. The main control section 48 can control the film formation process described below in accordance with the process recipe of the film formation process concerning, e.g., the film thickness and composition of a film to be formed, stored in the memory thereof in advance. In the memory, the relationship between the process gas flow rates and the thickness and composition of the film is also stored as control data in advance. Accordingly, the main control section 48 can control the elevating mechanism 25, gas supply circuits 28, 30, and 32, exhaust system GE, gas exciting section 50, heater 70, and so forth, based on the stored process recipe and control data.

Next, an explanation will be given of a film formation method (so called ALD film formation) performed in the apparatus shown in FIG. 1. In summary, this film formation method is arranged to supply the source gas (a first process gas for film formation) and the assist gas (a second process gas for reacting with the first process gas) to the process field 5 accommodating wafers W to form a thin film on the wafers W by CVD.

At first, the wafer boat 12 at room temperature, which supports a number of, e.g., 50 to 100, wafers having a diameter of 300 mm, is loaded into the process container 4 heated at a predetermined temperature. Then, the interior of the process container 4 is vacuum-exhausted and kept at a predetermined process pressure, and the wafer temperature is increased to a process temperature for film formation. At this time, the apparatus is in a waiting state until the temperature becomes stable.

Then, the source gas containing DCS gas and the assist gas containing $NH_3$ gas are intermittently supplied from the respective gas distribution nozzles 36 and 34 at controlled flow rates. More specifically, the source gas is supplied from the gas spouting holes 36A of the gas distribution nozzles 36 to form gas flows parallel with the wafers W on the wafer boat 12. The assist gas is supplied from the gas spouting holes 36A of the gas distribution nozzle 34 to form gas flows parallel with the wafers W on the wafer boat 12. The two gases react with each other on the wafers W, thereby forming a silicon nitride film on the wafers W.

The assist gas supplied from the gas spouting holes 36A of the gas distribution nozzle 34 is selectively excited and partly turned into plasma when it passes through the plasma generating area PS between the pair of electrodes 58. At this time, for example, radicals (activated species), such as N*, NH*, $NH_2$*, and $NH_3$*, are produced (the symbol [*] denotes that it is a radical). The radicals flow out from the opening 54 of the gas exciting section 50 toward the center of the process container 4, and are supplied into gaps between the wafers W in a laminar flow state.

The radicals react with molecules of DCS gas adsorbed on the surface of the wafers W, so that a silicon nitride film is formed on the wafers W. Alternatively, when DCS gas flows onto radicals adsorbed on the surface of the wafers W, the same reaction is caused, so that a silicon nitride film is formed on the wafers W.

Figure 3:
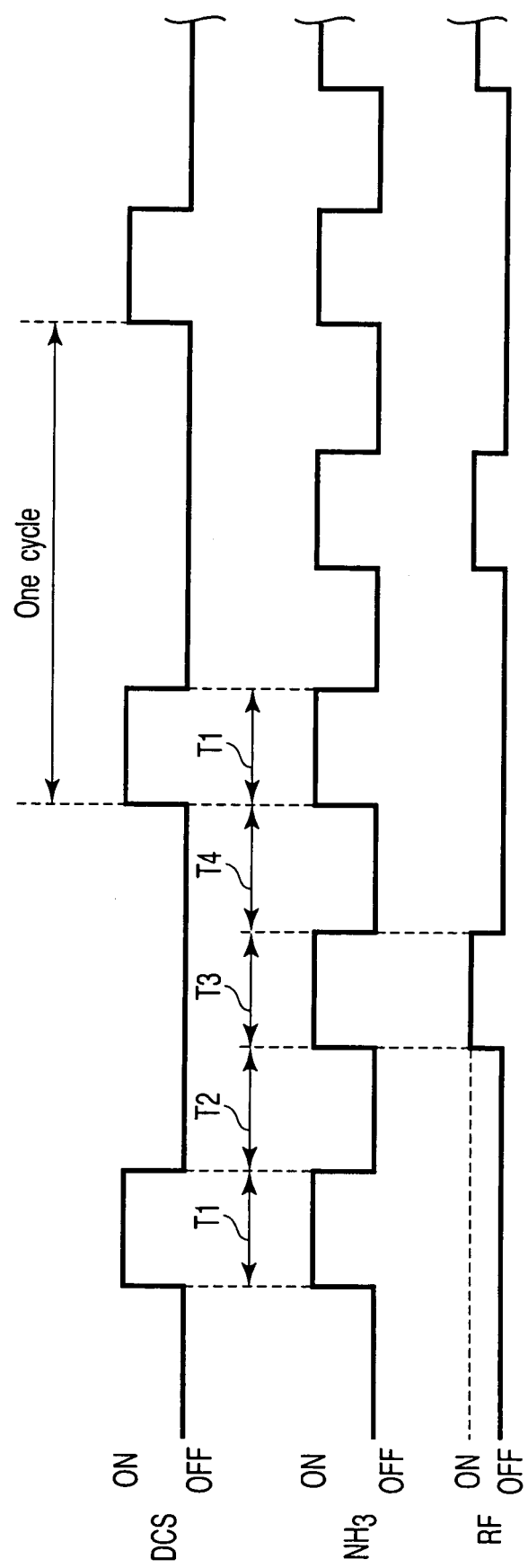
FIG. 3 is a timing chart of the gas supply and RF application of a film formation method according to the first embodiment.

FIG. 3 is a timing chart of the gas supply and RF application of a film formation method according to the first embodiment. As shown in FIG. 3, the film formation method according to this embodiment is arranged to alternately repeat first to fourth periods (first to fourth steps) T1 to T4. A cycle comprising the first to fourth periods T1 to T4 is repeated a number of times, and thin films of silicon nitride formed by respective cycles are laminated, thereby arriving at a silicon nitride film having a target thickness.

Specifically, the first period (first step) T1 is arranged to perform supply of the source gas (denoted as DCS in FIG. 3) and the assist gas (denoted as $NH_3$ in FIG. 3) to the process field 5. The second period (second step) T2 is arranged to stop supply of the source gas and assist gas to the process field 5. The third period (third step) T3 is arranged to perform supply of the assist gas to the process field 5, while stopping supply of the source gas to the process field 5. Further, the third period T3 is arranged to set the RF power supply 60 in the ON state to turn the assist gas into plasma by the gas exciting section 50, so as to supply the assist gas in an activated state to the process field 5. The fourth period (fourth step) T4 is arranged to stop supply of the source gas and assist gas to the process field 5.

Each of the second and fourth periods T2 and T4 is used as a purge period to remove the residual gas within the process container 4. The term "purge" means removal of the residual gas within the process container 4 by vacuum-exhausting the interior of the process container 4 while supplying an inactive gas, such as $N_2$ gas, into the process container 4, or by vacuum-exhausting the interior of the process container 4 while stopping supply of all the gases. In this respect, the first and third periods T1 and T3 may be arranged to stop vacuum-exhausting the process container 4 while supplying the source gas and assist gas. However, where supplying the source gas and assist gas is performed along with vacuum-exhausting the process container 4, the interior of the process container 4 can be continuously vacuum-exhausted over the entirety of the first to fourth periods T1 to T4.

In FIG. 3, the first period T1 is set to be within a range of from about 1 to 20 seconds, and, for example, at about 10 seconds, the second period T2 is set to be within a range of from about 1 to 20 seconds, and, for example, at about 10 seconds, the third period T3 is set to be within a range of from about 1 to 30 seconds, and, for example, at about 10 seconds, and the fourth period T4 is set to be within a range of from about 1 to 20 seconds, and, for example, at about 10 seconds. However, these values of time are merely examples and thus are not limiting.

As described above, the period T1 of simultaneously supplying the assist gas containing $NH_3$ gas and source gas containing DCS gas, and the period T3 of solely supplying the assist gas containing $NH_3$ gas are alternately performed with the purge periods T2 and T4 respectively interposed therebetween. This makes it possible to greatly increase the film formation rate of a silicon nitride film, while maintaining a high film quality. The reason of this is thought to be as follows. Specifically, when the assist gas and source gas are simultaneously supplied, DCS gas molecules adsorbed on the wafer surface are partly and incompletely nitrided by $NH_3$ gas concurrently supplied. In this case, the adsorption of DCS gas molecules proceeds without reaching saturation, and thus the amount of adsorbed DCS gas molecules in the first period T1 becomes higher than the conventional method (which solely supplies the source gas). Then, in the third period T3, the incompletely reacted portions are completely reacted with $NH_3$ gas excited by plasma, thereby forming a silicon nitride film with a high film formation rate.

The process conditions of the film formation process are as follows. The flow rate of DCS gas is set to be within a range of 100 to 3,000 sccm, e.g., at 1,000 sccm (1 slm). The flow rate of $NH_3$ gas is set to be within a range of 100 to 5,000 sccm, e.g., at 1,000 sccm. The process temperature is lower than ordinary CVD processes, and is set to be within a range of 180 to 600° C., e.g., at 550° C. If the process temperature is lower than 180° C., essentially no film is deposited because hardly any reaction is caused. If the process temperature is higher than 600° C., a low quality CVD film is deposited.

The process pressure is set to be within a range of 27 Pa (0.2 Torr) to 1,330 Pa (10 Torr), e.g., at 1 Torr during the first period (adsorption step) T1 and at 0.3 Torr during the third period (nitridation step using plasma) T3. If the process pressure is lower than 27 Pa, the film formation rate becomes lower than the practical level. If the process pressure is higher than 1,330 Pa, it becomes difficult to generate plasma.

In the first period (adsorption step) T1, the flow rate ratio [$DCS/NH_3$] between DCS gas and $NH_3$ gas is set to be within a range of 1/10 to 10. If the flow rate ratio of $NH_3$ gas is too low, essentially no effect can be obtained by simultaneously supplying $NH_3$ gas. If the flow rate ratio of $NH_3$ gas is too high, the film formation itself cannot proceed.

Experiment 1

Figure 13:
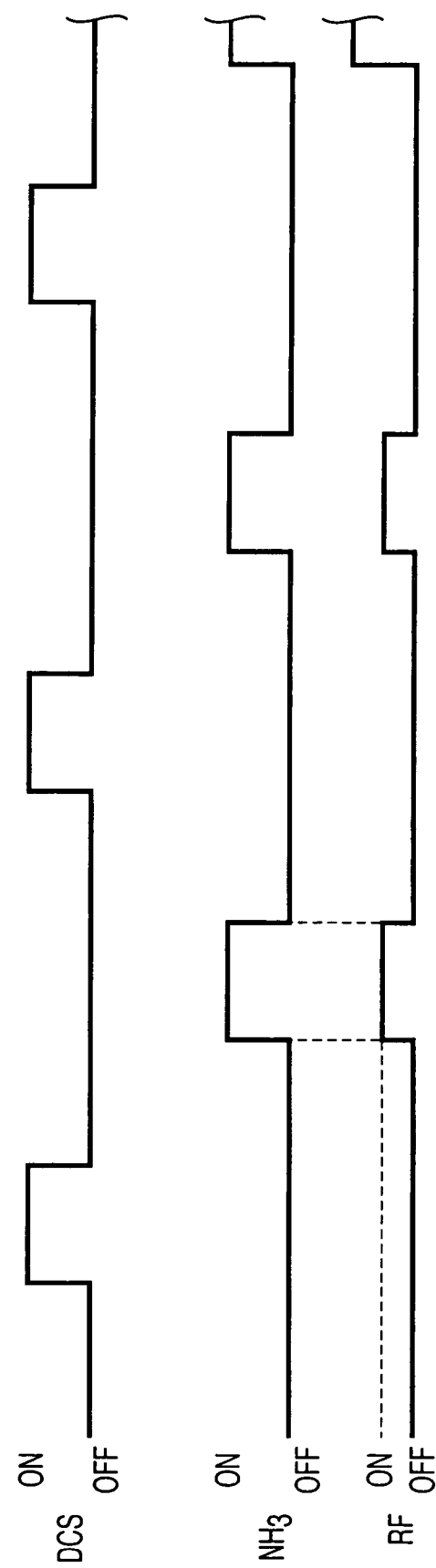
FIG. 13 is a timing chart of the gas supply and RF application of a conventional film formation method.

An experiment 1 was conducted to examine a film formation method according to the first embodiment using the timing chart shown in FIG. 3, as compared with a conventional film formation method (ALD method) using the timing chart shown in FIG. 13, while forming a silicon nitride film by these film formation methods. In two present examples PE1 and PE2 according to the first embodiment, the flow rate of $NH_3$ gas was set at 500 sccm (0.5 slm) and 1,000 sccm (1 slm), respectively. In a comparative example CE1 according to the conventional film formation method, the flow rate of $NH_3$ gas was set at 1,000 sccm (1 slm). In these examples, the number of film formation cycles was set at 160.

Figure 4:
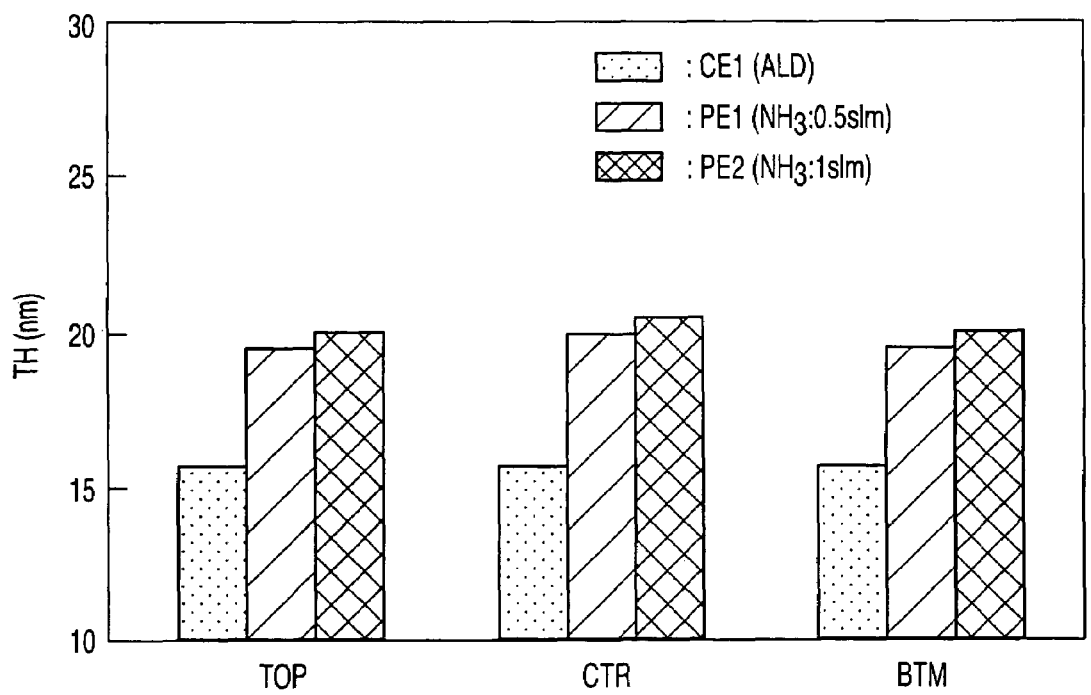
FIG. 4 is a graph showing film thickness data of a silicon nitride film, obtained by Experiment 1 according to the first embodiment.
Figure 5:
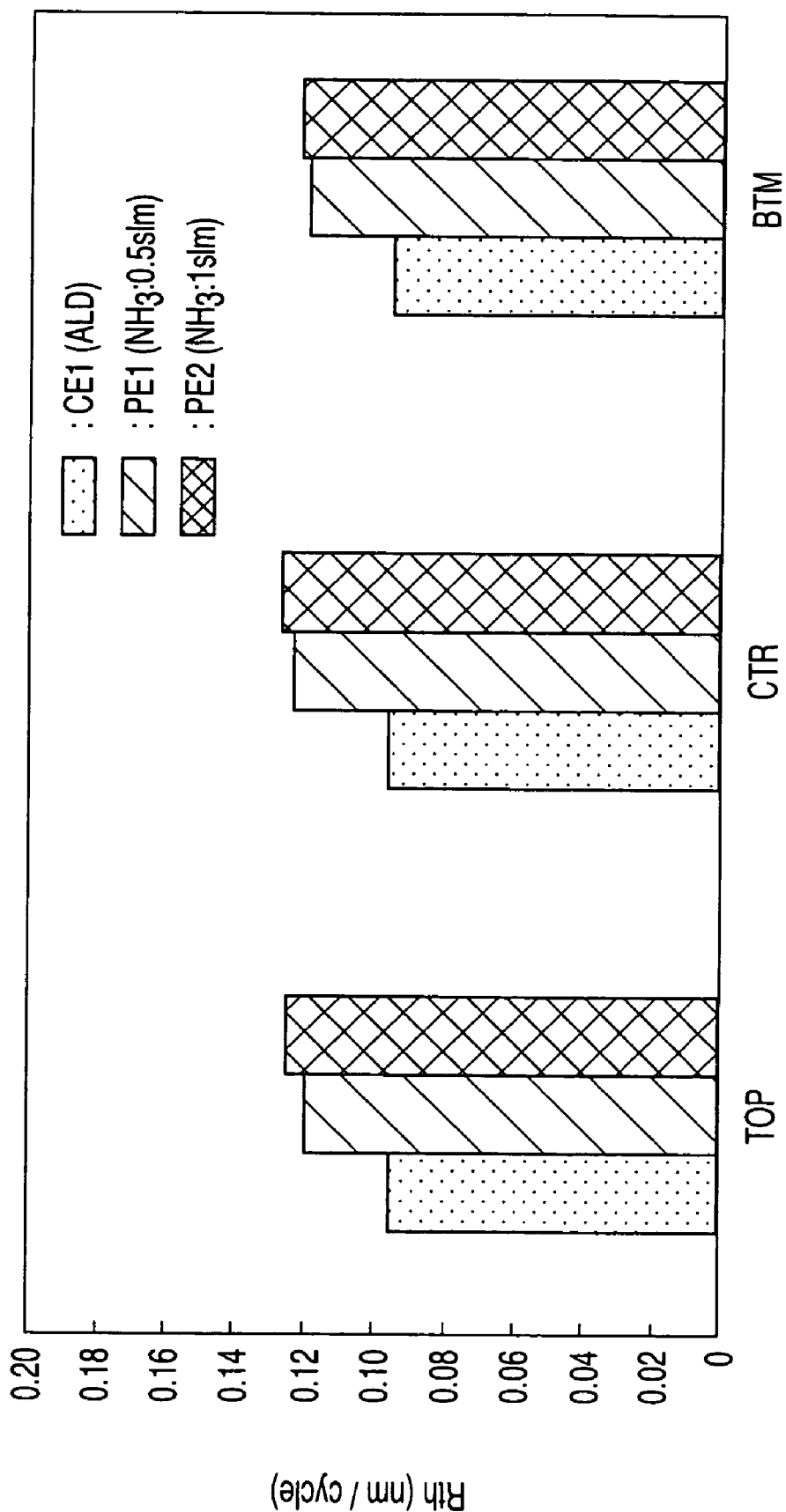
FIG. 5 is a graph showing film formation rate of a silicon nitride film, obtained by Experiment 1.
Figure 7:
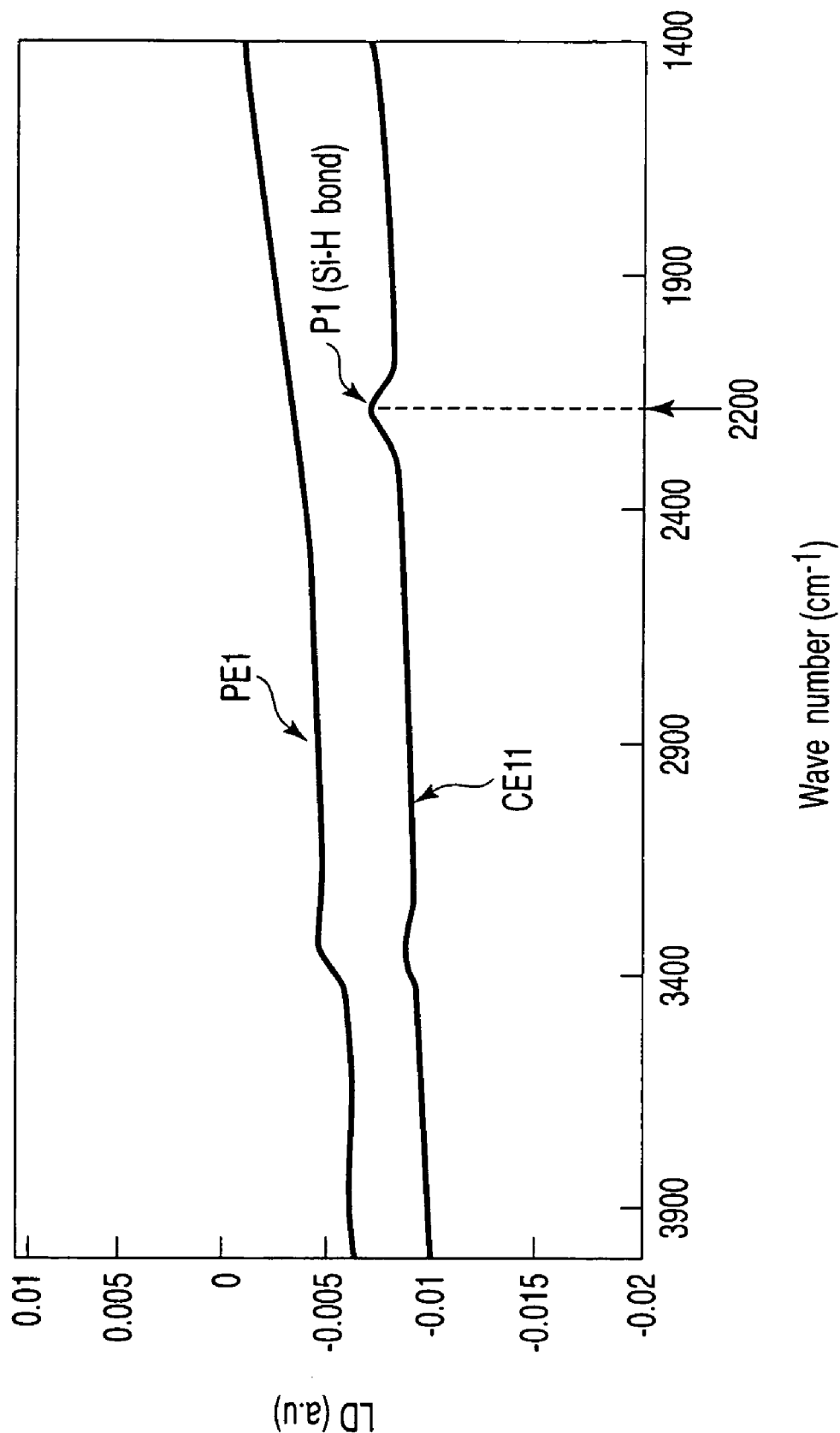
FIG. 7 is a graph showing the result of infrared diffraction performed on a silicon nitride film, obtained by Experiment 1.

FIG. 4 is a graph showing film thickness data of a silicon nitride film, obtained by Experiment 1. FIG. 5 is a graph showing film formation rate of a silicon nitride film, obtained by Experiment 1. FIG. 6 is a graph showing planar uniformity of the film thickness of a silicon nitride film, obtained by Experiment 1. FIG. 7 is a graph showing the result of infrared diffraction performed on a silicon nitride film, obtained by Experiment 1. In FIGS. 4 to 7, "TOP", "CTR", and "BTM" denote semiconductor wafers at top, central, and bottom positions of the wafer boat, respectively.

Referring to FIG. 4 showing the film thickness TH (nm) of a silicon nitride film, the comparative example CE1 resulted in a TH of about 15 nm, without reference to the wafer positions. On the other hand, both of the two present examples PE1 and PE2 resulted in a TH of about 20 nm, without reference to the wafer positions. Accordingly, it has been confirmed that the two present examples PE1 and PE2 can deposit a silicon nitride film having a larger thickness, as compared with the comparative example CE1.

Referring to FIG. 5 showing film formation rate per cycle Rth (nm/cycle), the comparative example CE1 resulted in an Rth of about 0.1 nm. On the other hand, the two present examples PE1 and PE2 resulted in an Rth of about 0.12 nm to 0.13 nm. Accordingly, it has been confirmed that the two present examples PE1 and PE2 can increase the film formation rate, as compared with the comparative example CE1.

Referring to FIG. 6 showing planar uniformity PTuni (±%) in film thickness, the comparative example CE1 resulted in a PTuni of about ±3.5 to 4.5%. On the other hand, the two present examples PE1 and PE2 resulted in a PTuni of about ±3.0 to 4.0%. Accordingly, it has been confirmed that the two present examples PE1 and PE2 can improve the planar uniformity in film thickness, as compared with the comparative example CE1.

Referring to FIG. 7 showing infrared intensity LD (a.u) obtained by infrared diffraction on the film, a comparative example CE11 showed the peak P1 in LD representing the presence of "Si—H bonds" at about a wave number of about 2,200. This comparative example CE11 was a silicon nitride film formed by LP (low pressure) CVD, using hexachlorodisilane (HCD) as a process gas. On the other hand, the present example PE1 showed a relatively flat line of LD over the entire wave number. Accordingly, it has been confirmed that the present example PE1 can provide better film quality, as compared with the comparative example CE11.

Figure 8:
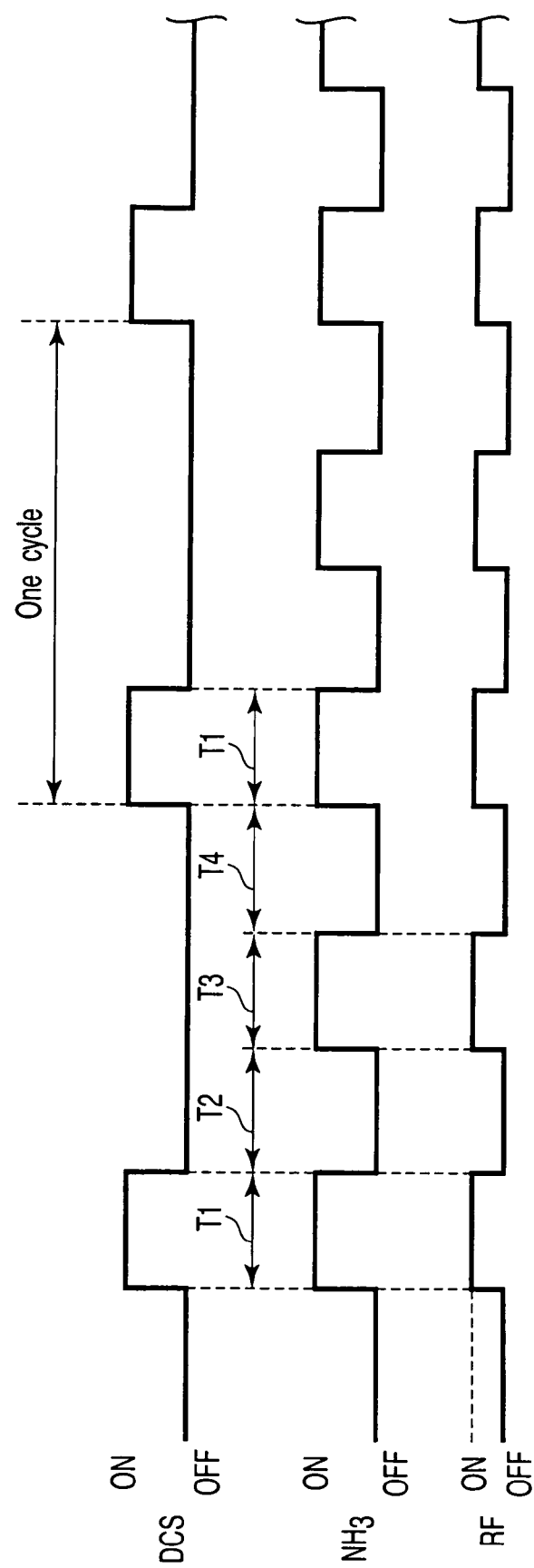
FIG. 8 is a timing chart of the gas supply and RF application of a film formation method according to a modification of the first embodiment.

In the timing chart shown in FIG. 3, the RF is set in the OFF state during the period T1 of simultaneously supplying the assist gas containing $NH_3$ gas and the source gas containing DCS gas, while the RF is set in the ON state during the period T3 of solely supplying the assist gas containing $NH_3$ gas. Alternatively, an RF application shown in FIG. 8 may be used. FIG. 8 is a timing chart of the gas supply and RF application of a film formation method according to a modification of the first embodiment.

In the timing chart shown in FIG. 8, the RF is set in the ON state to excite the assist gas containing $NH_3$ gas during both of the period T1 of simultaneously supplying the assist gas containing $NH_3$ gas and the source gas containing DCS gas, and the period T3 of solely supplying the assist gas containing $NH_3$ gas. In this case, since the assist gas is excited while the source gas is supplied in the first period T1, DCS and $NH_3$ radicals are adsorbed on the semiconductor wafers W. Then, in the third period T3, the incompletely reacted portions are completely reacted with $NH_3$ gas excited by plasma, thereby forming a silicon nitride film with a higher film formation rate.

Experiment 2

As a nitriding gas, $N_2$ gas may be used in place of $NH_3$ gas. In Experiment 2, a silicon nitride film was formed by a method in accordance with FIG. 3 except for $N_2$ gas being used in place of $NH_3$ gas. This example showed a film formation rate of 0.1 nm/cycle. Further, a silicon nitride film was formed by a method in accordance with FIG. 8 except for $N_2$ gas being used in place of $NH_3$ gas. This example showed a film formation rate of 0.5 nm/cycle. Accordingly, it has been confirmed that, where $N_2$ gas is used in place of $NH_3$ gas as a nitriding gas, the film formation rate can be greatly improved by a method in accordance with FIG. 8.

Second Embodiment

Figure 9:
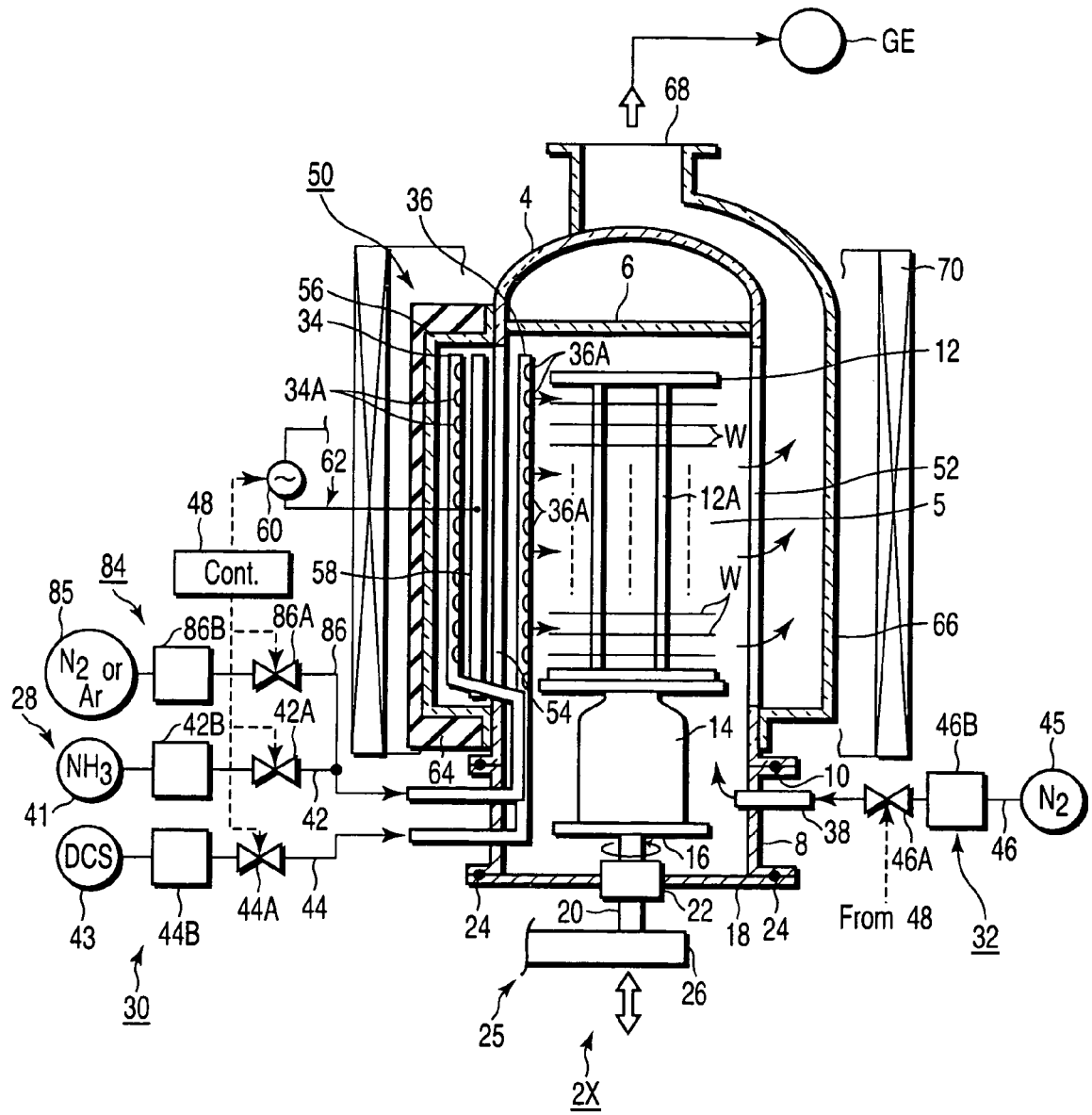
FIG. 9 is a sectional view showing a film formation apparatus (vertical CVD apparatus) according to a second embodiment of the present invention.

FIG. 9 is a sectional view showing a film formation apparatus (vertical CVD apparatus) according to a second embodiment of the present invention. The film formation apparatus 2X according to the second embodiment includes a supplementary gas supply circuit (third process gas supply circuit) 84 in addition to the assist gas supply circuit (second process gas supply circuit) 28, source gas supply circuit (first process gas supply circuit) 30, and purge gas supply circuit 32. The supplementary gas supply circuit 84 is arranged to supply a supplementary gas different from the source gas and assist gas. Specifically, the supplementary gas contains a gas selected from the group consisting of nitrogen gas, rare gas, nitrogen oxide gas, such as $N_2$ or Ar gas used in this embodiment. The film formation apparatus 2X shown in FIG. 9 has essentially the same structure as the film formation apparatus 2 shown in FIG. 1 except for the portions relating to the supplementary gas supply circuit 84.

The supplementary gas supply circuit 84 shares with the assist gas supply circuit 28 a common gas distribution nozzle 34 and thus gas spouting holes 34A formed in the gas distribution nozzle 34. For this, the nozzle 34 is connected to an $N_2$ or Ar gas source 85 through a gas supply line (gas passage) 86 of the supplementary gas supply circuit 84. The gas supply line 86 is provided with a switching valve 86A and a flow rate controller 86B, such as a mass flow controller. With this arrangement, $N_2$ or Ar gas can be supplied at a controlled flow rate. The supplementary gas may be a nitrogen oxide gas in place of an inactive gas, such as nitrogen gas or rare gas.

As described above, the gas distribution nozzle 34 is formed of a quartz pipe, which penetrates the sidewall of the manifold 8 from the outside and then turns and extends upward. The gas distribution nozzle 34 has a plurality of gas spouting holes 34A formed at predetermined intervals in the longitudinal direction (the vertical direction) over all the wafers W on the wafer boat 12. The gas spouting holes 34A deliver the assist gas or supplementary gas almost uniformly in the horizontal direction, so as to form gas flows parallel with the wafers W on the wafer boat 12. The supplementary gas supply circuit 84 may include its own gas distribution nozzle juxtaposed to the gas distribution nozzle 34, without sharing the gas distribution nozzle 34 with the assist gas supply circuit 28.

Next, an explanation will be given of a film formation method (so called ALD film formation) performed in the apparatus shown in FIG. 9. In summary, this film formation method is arranged to supply the source gas (a first process gas for film formation), the assist gas (a second process gas for reacting with the first process gas), and the supplementary gas (third process gas) described above to the process field 5 accommodating wafers W to form a thin film on the wafers W by CVD.

At first, the wafer boat 12 at room temperature, which supports a number of, e.g., 50 to 100, wafers having a diameter of 300 mm, is loaded into the process container 4 heated at a predetermined temperature. Then, the interior of the process container 4 is vacuum-exhausted and kept at a predetermined process pressure, and the wafer temperature is increased to a process temperature for film formation. At this time, the apparatus is in a waiting state until the temperature becomes stable.

Then, the source gas containing DCS gas, the assist gas containing $NH_3$ gas, and the supplementary gas are intermittently supplied from the respective gas distribution nozzles 36 and 34 at controlled flow rates. More specifically, the source gas is supplied from the gas spouting holes 36A of the gas distribution nozzles 36 to form gas flows parallel with the wafers W on the wafer boat 12. The assist gas and supplementary gas are supplied from the gas spouting holes 36A of the gas distribution nozzle 34 to form gas flows parallel with the wafers W on the wafer boat 12. DCS gas and $NH_3$ gas react with each other on the wafers W, thereby forming a silicon nitride film on the wafers W.

Figure 10:
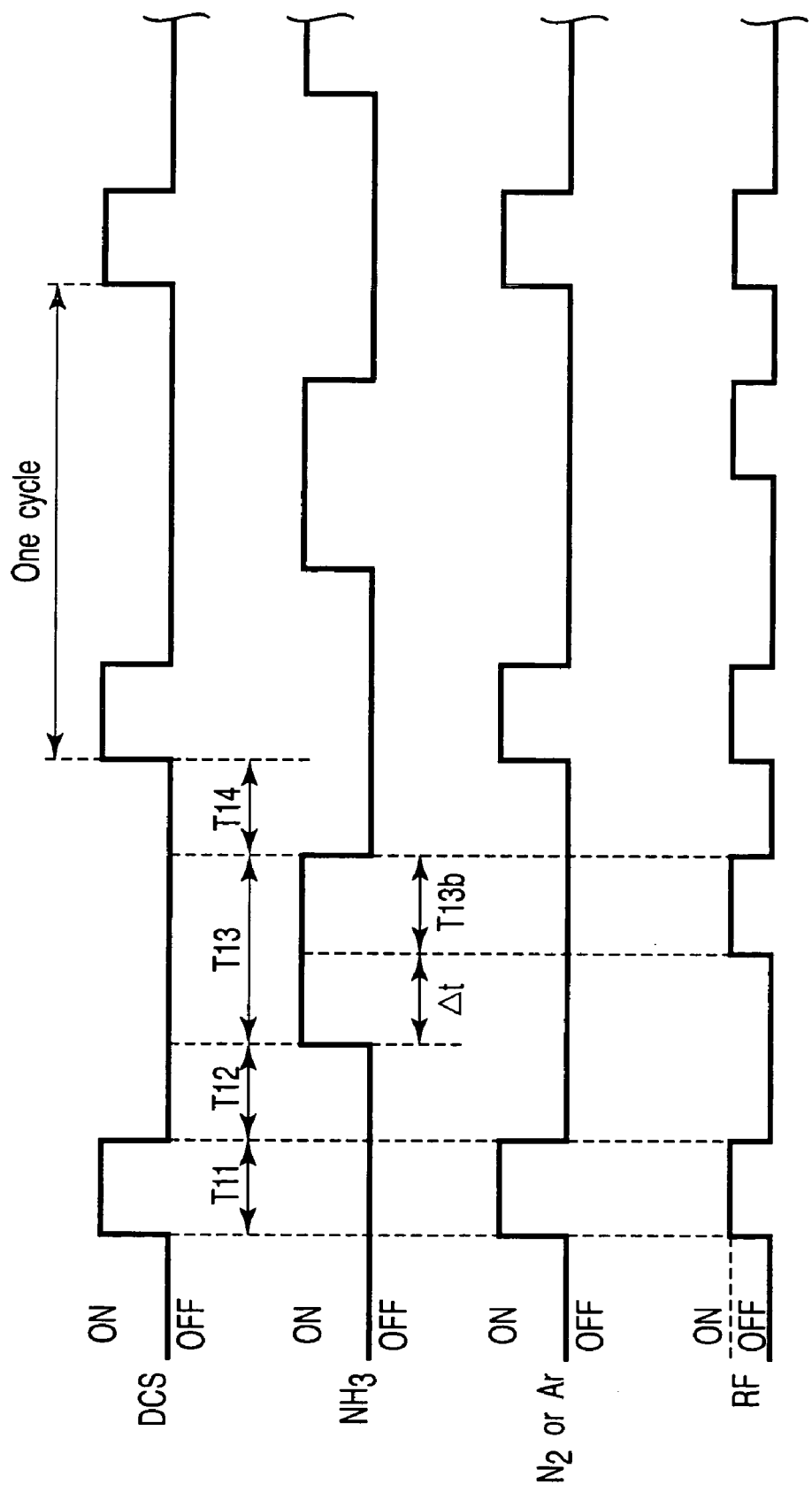
FIG. 10 is a timing chart of the gas supply and RF application of a film formation method according to the second embodiment of the present invention.

FIG. 10 is a timing chart of the gas supply and RF application of a film formation method according to the second embodiment of the present invention. As shown in FIG. 10, the film formation method according to this embodiment is arranged to alternately repeat first to fourth periods (first to fourth steps) T11 to T14. A cycle comprising the first to fourth periods T11 to T14 is repeated a number of times, and thin films of silicon nitride formed by respective cycles are laminated, thereby arriving at a silicon nitride film having a target thickness.

Specifically, the first period (first step) T11 is arranged to perform supply of the source gas (denoted as DCS in FIG. 10) and the supplementary gas (denoted as $N_2$ or Ar in FIG. 10) to the process field 5, while stopping supply of the assist gas (denoted as $NH_3$ in FIG. 10) to the process field 5. Further, the first period T11 is arranged to set the RF power supply 60 in the ON state to turn the supplementary gas into plasma by the gas exciting section 50, so as to supply the supplementary gas in an activated state to the process field 5. The second period (second step) T12 is arranged to stop supply of the source gas, assist gas, and supplementary gas to the process field 5. The third period (third step) T13 is arranged to perform supply of the assist gas to the process field 5, while stopping supply of the source gas and supplementary gas to the process field 5. Further, halfway through the third period T13, the RF power supply 60 is set in the ON state to turn the assist gas into plasma by the gas exciting section 50, so as to supply the assist gas in an activated state to the process field 5 during a sub-period T13$b$. The fourth period (fourth step) T14 is arranged to stop supply of the source gas, assist gas, and supplementary gas to the process field 5.

Each of the second and fourth periods T12 and T14 is used as a purge period to remove the residual gas within the process container 4. The term "purge" means removal of the residual gas within the process container 4 by vacuum-exhausting the interior of the process container 4 while supplying an inactive gas, such as $N_2$ gas, into the process container 4, or by vacuum-exhausting the interior of the process container 4 while stopping supply of all the gases. In this respect, the first and third periods T11 and T13 may be arranged to stop vacuum-exhausting the process container 4 while supplying the source gas, assist gas, and supplementary gas. However, where supplying the source gas, assist gas, and supplementary gas is performed along with vacuum-exhausting the process container 4, the interior of the process container 4 can be continuously vacuum-exhausted over the entirety of the first to fourth periods T11 to T14.

In FIG. 10, the first period T11 is set to be within a range of from about 1 to 20 seconds, and, for example, at about 10 seconds, the second period T12 is set to be within a range of from about 1 to 20 seconds, and, for example, at about 10 seconds, the third period T13 is set to be within a range of from about 1 to 30 seconds, and, for example, at about 20 seconds, the sub-period T13$b$ is set to be within a range of from about 1 to 25 seconds, and, for example, at about 15 seconds, and the fourth period T14 is set to be within a range of from about 1 to 20 seconds, and, for example, at about 10 seconds. However, these values of time are merely examples and thus are not limiting.

As described above, when the supplementary gas is supplied and excited, radicals of the supplementary gas are generated, which promote decomposition of the source gas concurrently supplied. As a result, the film formation rate of a silicon nitride film is improved. Particularly, where $N_2$ gas is used as the supplementary gas, it not only promotes decomposition of the source gas, but also brings about nitrogen radicals, which react with silicon radicals to directly form SiN. As a result, the film formation rate of a silicon nitride film can be further improved.

In the second embodiment, the process temperature and process pressure, and the flow rates of DCS gas and $NH_3$ gas are the same as those of the first embodiment. The flow rate of the supplementary gas is set to be lower than the flow rate of the source gas or DCS gas, and, for example, at about one tenth of the flow rate of DCS gas.

In the third period T13, the RF power supply 60 is turned on after a predetermined time Δt passes, to turn the assist gas into plasma by the gas exciting section 50, so as to supply the assist gas in an activated state to the process field 5 during the sub-period T13$b$. The predetermined time Δt is defined by a time necessary for stabilizing the flow rate of $NH_3$ gas, which is set at, e.g., about 5 seconds. However, as in the first embodiment, the assist gas may be turned into plasma by the gas exciting section 50 over the entire period of supplying the assist gas. Since the RF power supply is turned on to generate plasma after the flow rate of the assist gas is stabilized, the uniformity of radical concentration among the wafers W (uniformity in the vertical direction) is improved.

Experiment 3

An experiment 3 was conducted to examine a film formation method according to the second embodiment using the timing chart shown in FIG. 10, as compared with a conventional film formation method (ALD method) using the timing chart shown in FIG. 13, while forming a silicon nitride film by these film formation methods. In two present examples PE11 and PE12 according to the second embodiment, $N_2$ gas and Ar gas were respectively used as the supplementary gas. In a comparative example CE1 according to the conventional film formation method, the conditions were set in accordance with the timing chart shown in FIG. 13 with no supplementary gas (i.e., essentially the same as the comparative example CE1 of Experiment 1). In these examples, the number of film formation cycles was set at 160.

FIG. 11A is a graph showing film formation rate of a silicon nitride film, obtained by Experiment 3. FIG. 11B is a graph showing improvement ratio of film formation rate of a silicon nitride film, obtained by Experiment 3. In FIGS. 11A and 11B, "TOP", "CTR", and "BTM" denote semiconductor wafers at top, central, and bottom positions of the wafer boat, respectively.

Referring to FIG. 11A showing film formation rate per cycle Rth (nm/cycle), the comparative example CE1 resulted in an Rth of about 0.1 nm, without reference to the wafer positions. On the other hand, the present example PE11 using $N_2$ gas as the supplementary gas resulted in an Rth of about 0.45 nm to 0.55 nm. The present example PE12 using Ar gas as the supplementary gas resulted in an Rth of about 0.25 nm to 0.4 nm.

Referring to FIG. 11B showing improvement ratio of film formation rate IRth (%), the present example PE11 using $N_2$ gas as the supplementary gas resulted in an IRth of about 150 to 300%. The present example PE12 using Ar gas as the supplementary gas resulted in an IRth of about 300 to 500%.

Accordingly, it has been confirmed that the two present examples PE11 and PE12 can increase the film formation rate, as compared with the comparative example CE1. The reason for the present example PE11 showing a higher film formation rate than the present example PE12 is thought to be as follows. Specifically, as described above, $N_2$ gas radicals can not only promote decomposition of the source gas, but also react with activated silicon to directly form silicon nitride.

Common Matters and Modifications of First and Second Embodiments

Figure 12:
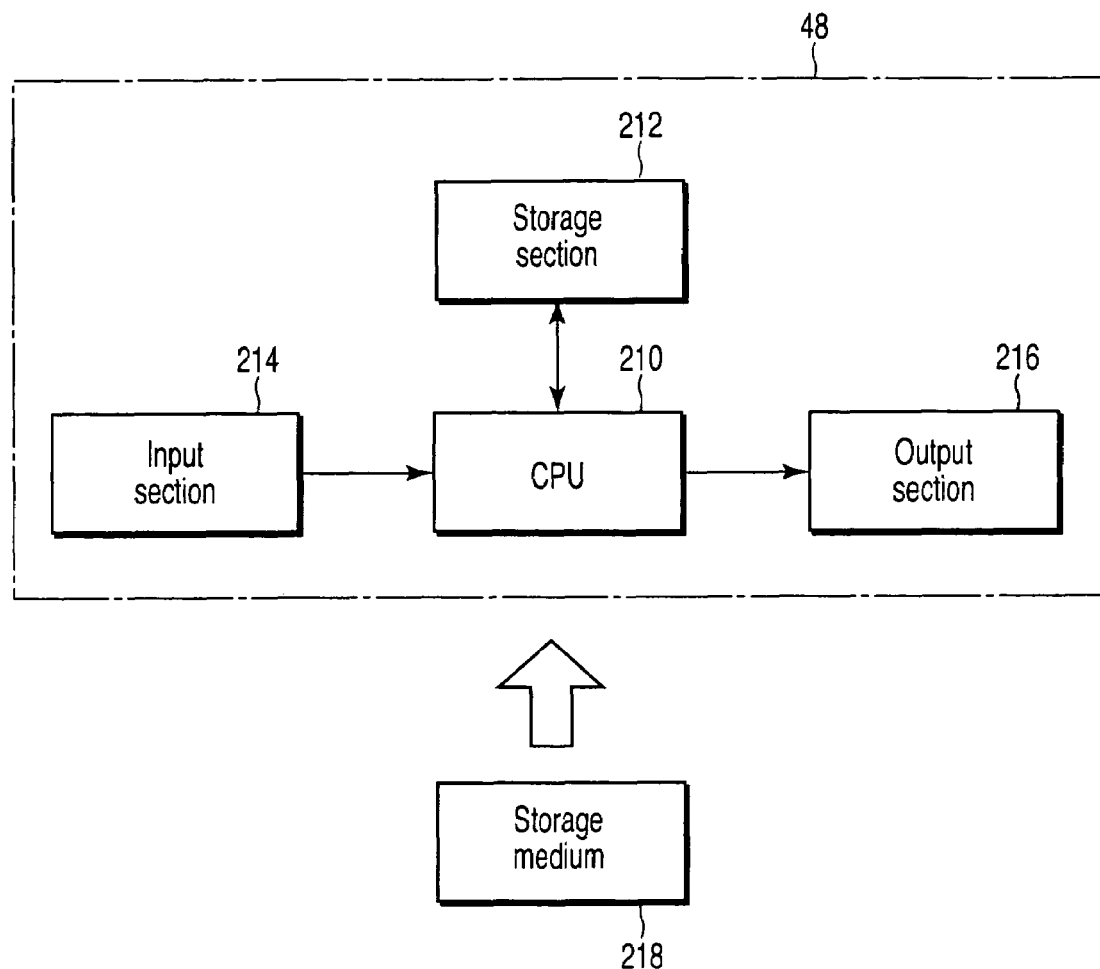
FIG. 12 is a block diagram schematically showing the structure of a main control section.

Each of the methods according to the first and second embodiment is performed under the control of the main control section 48 in accordance with a process program, as described above. FIG. 12 is a block diagram schematically showing the structure of the main control section 48. The main control section 48 includes a CPU 210, which is connected to a storage section 212, an input section 214, and an output section 216. The storage section 212 stores process programs and process recipes. The input section 214 includes input devices, such as a keyboard, a pointing device, and a storage media drive, to interact with an operator. The output section 216 outputs control signals for controlling components of the processing apparatus. FIG. 12 also shows a storage medium 218 attached to the computer in a removable state.

Each of the methods according to the first and second embodiment may be written as program instructions for execution on a processor, into a computer readable storage medium or media to be applied to a semiconductor processing apparatus. Alternately, program instructions of this kind may be transmitted by a communication medium or media and thereby applied to a semiconductor processing apparatus. Examples of the storage medium or media are a magnetic disk (flexible disk, hard disk (a representative of which is a hard disk included in the storage section 212), etc.), an optical disk (CD, DVD, etc.), a magneto-optical disk (MO, etc.), and a semiconductor memory. A computer for controlling the operation of the semiconductor processing apparatus reads program instructions stored in the storage medium or media, and executes them on a processor, thereby performing a corresponding method, as described above.

In the first and second embodiment, the source gas comprises DCS gas as a silane family gas. Alternatively, the source gas may comprise one or more gases selected from the group consisting of dichlorosilane (DCS), hexachlorodisilane (HCD), monosilane ($SiH_4$), disilane ($Si_2Cl_6$), hexamethyldisilazane (HMDS), tetrachlorosilane (TCS), disilylamine (DSA), trisilylamine (TSA), bistertialbutylaminosilane (BTBAS).

In the first and second embodiment, the assist gas comprises a nitriding gas, such as $NH_3$ gas or $N_2$ gas. Alternatively, the assist gas may comprise an oxy-nitriding gas, such as dinitrogen oxide ($N_2O$) or nitrogen oxide (NO). Alternatively, the assist gas may comprise an oxidizing gas.

In the second embodiment, a rare gas used as the supplementary gas may be He, Ne, Kr, or Xe gas, in place of Ar gas. A nitrogen oxide used as the supplementary gas may be dinitrogen oxide ($N_2O$), nitrogen oxide (NO), or nitrogen dioxide (NO2).

In the first and second embodiment, the exciting section 50 for generating plasma of the film formation apparatus 2 is integrally combined with the process container 4. Alternatively, the exciting section 50 may be separately disposed from the process container 4, so as to excite $NH_3$ gas outside the process container 4 (so called remote plasma), and then supply the excited $NH_3$ gas into the process container 4. A target substrate is not limited to a semiconductor wafer, and it may be another substrate, such as an LCD substrate or glass substrate.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A film formation method for a semiconductor process for forming a thin film on a target substrate by CVD, while supplying a first process gas for film formation and a second process gas for reacting with the first process gas to a process field accommodating the target substrate, the method alternately comprising:
    a first step of performing supply of the first and second process gases to the process field;
    a second step of stopping supply of the first and second process gases to the process field;
    a third step of performing supply of the second process gas to the process field while not performing supply of the first process gas to the process field; and
    a fourth step of stopping supply of the second process gas to the process field and not performing supply of the first process gas to the process field.

2. The method according to claim 1, wherein the third step comprises a period of supplying the second process gas to the process field, while exciting the second process gas by an exciting mechanism.

3. The method according to claim 2, wherein the first step comprises no period of exciting the second process gas by the exciting mechanism.

4. The method according to claim 2, wherein the first step comprises a period of supplying the second process gas to the process field while exciting the second process gas by an exciting mechanism.

5. The method according to claim 2, wherein the exciting mechanism comprises a plasma generating area disposed in a space communicating with the process field and between a supply port of the second process gas and the target substrate, and the second process gas is excited while passing through the plasma generating area.

6. The method according to claim 5, wherein the first process gas is supplied to the process field from a position between the plasma generating area and the target substrate.

7. The method according to claim 1, wherein each of the second and fourth steps comprises a period of supplying a purge gas to the process field.

8. The method according to claim 1, wherein gas inside the process field is kept exhausted during formation of the thin film.

9. The method according to claim 1, wherein the first process gas contains a silane family gas, and the second process gas contains a nitriding gas or oxy-nitriding gas.

10. The method according to claim 9, wherein the first process gas contains at least one gas selected from the group consisting of dichlorosilane, hexachlorodisilane, monosilane, disilane, hexamethyldisilazane, tetrachlorosilane, disilylamine, trisilylamine, and bistertialbutylaminosilane, and the second process gas contains at least one gas selected from the group consisting of ammonia, nitrogen, dinitrogen oxide, and nitrogen oxide.

11. A film formation method for a semiconductor process for forming a thin film on a target substrate by CVD, while supplying a first process gas for film formation, a second process gas for reacting with the first process gas, and a third process gas different from first and second process gases to a process field accommodating the target substrate, the method alternately comprising:
    a first step of performing supply of the first and third process gases to the process field while not performing supply of the second process gas to the process field, the first step comprising a period of supplying the third process gas to the process field while exciting the third process gas by an exciting mechanism;
    a second step of stopping supply of the first and third process gases to the process field and not performing supply of the second process gas to the process field;
    a third step of performing supply of the second process gas to the process field while not performing supply of the first and third process gases to the process field; and
    a fourth step of stopping supply of the second process gas to the process field and not performing supply of the first and third process gases to the process field.

12. The method according to claim 11, wherein the exciting mechanism comprises a plasma generating area disposed in a space communicating with the process field and between a supply port of the third process gas and the target substrate, and the third process gas is excited while passing through the plasma generating area.

13. The method according to claim 12, wherein the first process gas is supplied to the process field from a position between the plasma generating area and the target substrate.

14. The method according to claim 11, wherein the third step comprises an excitation period of supplying the second process gas to the process field while exciting the second process gas by the exciting mechanism.

15. The method according to claim 14, wherein the third step further comprises a period of supplying the second process gas to the process field while not exciting the second process gas by the exciting mechanism, before the excitation period.

16. The method according to claim 14, wherein the second process gas shares a supply port with the third process gas.

17. The method according to claim 11, wherein each of the second and fourth steps comprises a period of supplying a purge gas to the process field.

18. The method according to claim 11, wherein gas inside the process field is kept exhausted during formation of the thin film.

19. The method according to claim 11, wherein the first process gas contains a silane family gas, the second process gas contains a nitriding gas or oxy nitriding gas, and the third process gas contains a gas selected from the group consisting of nitrogen gas, rare gas, and nitrogen oxide gas.

20. The method according to claim 19, wherein the first process gas contains at least one gas selected from the group consisting of dichlorosilane, hexachlorodisilane, monosilane, disilane, hexamethyldisilazane, tetrachlorosilane, disilylamine, trisilylamine, and bistertialbutylaminosilane, and the second process gas contains at least one gas selected from the group consisting of ammonia, nitrogen, dinitrogen oxide, and nitrogen oxide.

* * * * *